United States Patent
Bai

(10) Patent No.: US 11,056,479 B2
(45) Date of Patent: Jul. 6, 2021

(54) CHIP, MANUFACTURING METHOD, AND MOBILE TERMINAL

(71) Applicant: GUANGDONG OPPO MOBILE TELECOMMUNICATIONS CORP., LTD., Guangdong (CN)

(72) Inventor: Jian Bai, Dongguan (CN)

(73) Assignee: GUANGDONG OPPO MOBILE TELECOMMUNICATIONS CORP., LTD., Guangdong (CN)

(*) Notice: Subject to any disclaimer, the term of this patent is extended or adjusted under 35 U.S.C. 154(b) by 0 days.

(21) Appl. No.: 16/870,115

(22) Filed: May 8, 2020

(65) Prior Publication Data
US 2020/0266186 A1  Aug. 20, 2020

Related U.S. Application Data

(62) Division of application No. 15/728,830, filed on Oct. 10, 2017, now abandoned.

(30) Foreign Application Priority Data

Mar. 13, 2017 (CN) .......................... 201710147079.4

(51) Int. Cl.
| | |
|---|---|
| H01L 27/02 | (2006.01) |
| H01L 21/822 | (2006.01) |
| G06F 30/392 | (2020.01) |
| C30B 15/00 | (2006.01) |
| H01L 21/78 | (2006.01) |
| C30B 29/06 | (2006.01) |

(52) U.S. Cl.
CPC .......... *H01L 27/0207* (2013.01); *C30B 15/00* (2013.01); *C30B 29/06* (2013.01); *G06F 30/392* (2020.01); *H01L 21/78* (2013.01); *H01L 21/822* (2013.01)

(58) Field of Classification Search
None
See application file for complete search history.

(56) References Cited

U.S. PATENT DOCUMENTS

| | | | |
|---|---|---|---|
| 5,801,406 A | 9/1998 | Lubow | |
| 6,040,632 A | 3/2000 | Low | |
| 6,078,096 A | 6/2000 | Kimura | |
| (Continued) | | | |

FOREIGN PATENT DOCUMENTS

| | | |
|---|---|---|
| CN | 104461649 A | 3/2015 |
| CN | 104600009 A | 5/2015 |
| (Continued) | | |

OTHER PUBLICATIONS

First Office Action of the Indian application No. 201714037980, dated Nov. 4, 2019.

(Continued)

*Primary Examiner* — Bo B Jang

(57) ABSTRACT

In a chip, a manufacturing method, and a mobile terminal, the chip includes a first region and a second region. The first region is formed by at least one first circuit unit set. The second region is formed by a second circuit unit set. The at least one first circuit unit set includes a plurality of identical circuit units. A number of circuit units in the first region determines a specification of the chip and a size of the first region of the chip.

8 Claims, 5 Drawing Sheets

(56) References Cited

U.S. PATENT DOCUMENTS

| | | | |
|---|---|---|---|
| 6,509,217 B1* | 1/2003 | Reddy | G06K 19/07749 438/153 |
| 6,544,490 B1* | 4/2003 | Takeno | C30B 15/203 423/328.2 |
| 7,763,396 B2 | 7/2010 | Douglas | |
| 8,792,080 B2 | 7/2014 | Sapp | |
| 9,589,902 B2 | 3/2017 | Matsumoto et al. | |
| 2002/0098603 A1 | 7/2002 | Mayer | |
| 2002/0136046 A1 | 9/2002 | Kim | |
| 2004/0245618 A1 | 12/2004 | Mayer | |
| 2005/0178622 A1 | 8/2005 | Blue | |
| 2007/0190432 A1 | 8/2007 | Douglas | |
| 2010/0244288 A1 | 9/2010 | Douglas | |
| 2012/0194792 A1 | 8/2012 | Sapp | |
| 2014/0071416 A1 | 3/2014 | Cho et al. | |
| 2014/0075396 A1 | 3/2014 | Cho et al. | |
| 2014/0075399 A1 | 3/2014 | Cho | |
| 2015/0279786 A1 | 10/2015 | Matsumoto et al. | |

FOREIGN PATENT DOCUMENTS

| | | |
|---|---|---|
| CN | 104617753 A | 5/2015 |
| CN | 104979331 A | 10/2015 |
| CN | 106057794 A | 10/2016 |
| KR | 20050030778 A | 3/2005 |

OTHER PUBLICATIONS

International Search Report in the international application No. PCT/CN2017/108152, dated Jan. 31, 2018.

Written Opinion Opinion of the international Search, Authority in the international application No. PCT/CN2017/108152, dated Jan. 31, 2018.

European Search Report in the European application No. 17196040.4, dated Apr. 30, 2018.

First Office Action of the Chinese application No. 201710147079.4, dated Mar. 20, 2019.

Second Office Action of the Chinese application No. 201710147079.4, dated May 10, 2019.

* cited by examiner

CHIP, MANUFACTURING METHOD, AND MOBILE TERMINAL

CROSS REFERENCE TO RELATED APPLICATIONS

This is a divisional application of U.S. patent application Ser. No. 15/728,830 filed on Oct. 10, 2017, which claims priority to Chinese Patent Application No. 201710147079.4, filed on Mar. 13, 2017 and entitled "CHIP, MANUFACTURING METHOD, AND MOBILE TERMINAL," the entire contents of which are incorporated herein by reference in their entireties.

BACKGROUND

Field

The present disclosure relates to a technical field of mobile terminals, and more particularly to a chip, a manufacturing method, and a mobile terminal.

Background

In chip-manufacturing technology, in order to achieve different chip configurations, chip-manufacturing methods include following operations. Chips are processed according to highest specification to obtain high-specification chips. To form lower specification chips, part of functional units of the high-specification chips is disabled by melting fuses thereof or other methods, or main operation frequencies of the high-specification chips are lowered.

Although the above operations of chip-manufacturing methods can make a lower specification chip, a core size or a die size of the lower specification chip is identical to a core size or a die size of the high-specification chip. For example, the die size of the high-specification chip is 10 mm*10 mm and the die size of the lower specification chip is also the same. Therefore, the conventional method of manufacturing the lower specification chip is apparently disadvantageous regarding the reduction of the cost.

DETAILED DESCRIPTION OF THE PREFERRED EMBODIMENTS

The following embodiments refer to the accompanying drawings for exemplifying specific implementable embodiments of the present disclosure in a suitable computing environment. It should be noted that the exemplary described embodiments are configured to describe and understand the present disclosure, but the present disclosure is not limited thereto.

In the descriptions of the present disclosure, the terms "center", "longitudinal", "lateral", "length", "width", "thickness", "upper", "lower", "front", "back", "left", "right", "vertical", "horizontal", "top", "bottom", "inner", "outer", "clockwise", "counterclockwise" directions, and other indicated directions or the position relation are based on the orientation or position relation shown in the figures. Only for convenience of describing the present disclosure and the simplification of the description, rather than indicating or implying that the means or elements referred to have a specific orientation, so that the above directions of the present disclosure cannot be understood as limitations. In addition, the terms "first" and "second" are used only for purposes of description, and cannot be understood to indicate or imply a relative importance or to implicitly indicate the number of technical features indicated. Thus, the features "first" and "second" can be expressly or implicitly included in one or more of the features. In the description of the present disclosure, the meanings of "multiple" are two or more, unless specifically limited otherwise.

Figure 1:
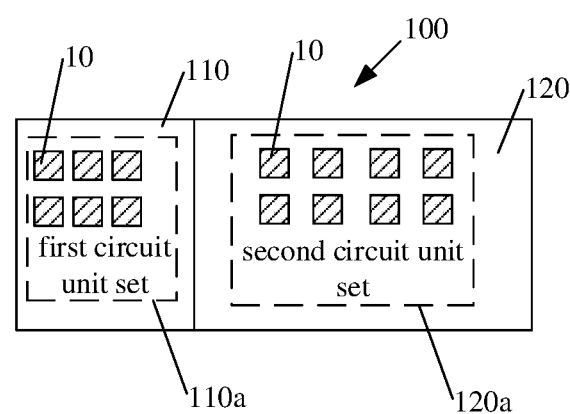
FIG. 1 is an illustrative structural diagram of a chip according to one embodiment of the present disclosure.

FIG. 1 is an illustrative structural diagram of a chip 100 according to one embodiment of the present disclosure. The chip 100 includes a first region 110 and a second region 120. The first region 110 is formed by at least one first circuit unit set 110a. The second region 120 is formed by a second circuit unit set 120a. The at least one first circuit unit set 110a includes identical circuit units 10. A number of the circuit units 110 in the first region 110 determines a specification of the chip 100 and a size of the first region 110. The specification of the chip includes a number of logic circuits of the chip. For example, the number of the logic circuits of a high-specification chip is greater than the number of the logic circuits of a lower specification chip. The specification of the chip includes an operational frequency of the chip. For example, the operational frequency of the high-specification chip is greater than the operational frequency of the lower specification chip.

The second circuit unit set 120a includes at least one circuit unit 10. For example, the at least one circuit unit 10 of the second circuit unit set 120a is the same as circuit units 10 in the at least one first circuit unit set 110a. The at least one circuit unit 10 of the second circuit unit set 120a can be also different from the circuit units 10 in the at least one first circuit unit set 110a. In addition, second circuit unit sets 120a in different specification chips are the same each other.

In one embodiment, a specification of the chip and size of the first region 110 are determined by the number of the circuit units 10 in the first region 110. The sizes of the chips in various types of specifications are correspondingly different, so that the size of lower specification chip and the number of the circuit units 10 in the first region 110 are relatively small, and the cost of the lower specification chip can be reduced. Additionally, since the lower specification chip is formed by physically adjusting the number of the circuit units 10 in the first region 110 for reducing specification level of chips, there is no need to form the lower specification chip by reducing performance of the high-specification chip using a fuse-melted manner, so that configuration efficiency of the chips having different specifications can be improved.

Figure 2:
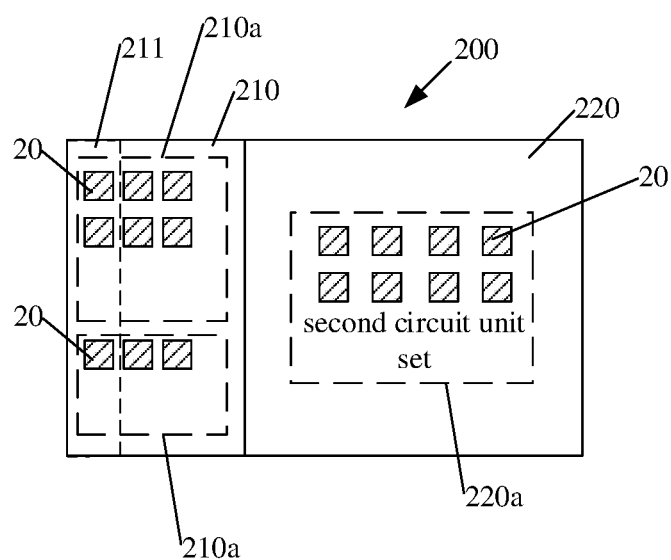
FIG. 2 is an illustrative structural diagram of a first chip according to one embodiment of the present disclosure.
Figure 3:
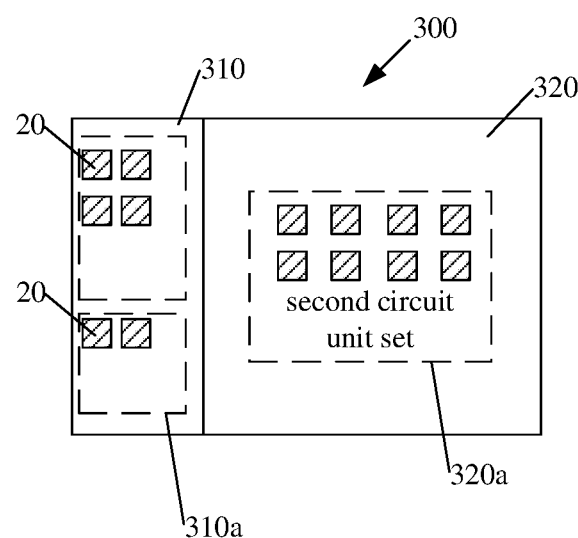
FIG. 3 is an illustrative structural diagram of a second chip according to one embodiment of the present disclosure.

In embodiments of FIG. 2 and FIG. 3, the chip is a first chip 200 or a second chip 300. The specification of the first chip 200 is better than the specification of the second chip 300. The size of the first region 210 of the first chip 200 is greater than size of the first region 310 of the second chip 300. The first chip 200 has at least one more circuit unit 20 (e.g., three circuit units in FIG. 2) than the second chip 300.

The at least one circuit unit 20 is arranged in a side region 211 of the first region 210, and except the side region 211, an area of an region of the first chip 200 is the same as an area of an region of the second chip 300. In other words, the first chip 200 is the same as the second chip 300 except the side region 211.

The difference between the first chip 200 and the second chip 300 is the at least one circuit unit 20 in the side region 211. In other words, the second chip 300 can be regarded as part of the first chip 200. The side region 211 is easily distinguished from the first chip 200. In view of chip design and manufacturing stages, as long as the first chip 200 is stably formed, the second chip 300 can be formed by only directly cutting the side region 211 of the first chip 200, so that the cost expenditure of the second chip 300 in the development and manufacturing stages is greatly reduced. The manufacturing methods of the first chip 200 and the second chip 300 can reduce the cost and improve the competitiveness of products.

In one embodiment, the circuit units include a plurality of analog circuits or digital circuits.

In one embodiment, each of the circuit units is selected from the group consisting of transistors, resistors, capacitors, inductors, and metal wirings. The transistors can be, for example, a diode, a triode, a field-effect transistor and the like. The number of components, such as transistors, resistors, capacitors, inductors, and metal wirings, in the circuit units of the present disclosure is not limited.

In one embodiment, a shape of the chip 100 is selected from the group consisting of a square shape, a rectangular shape, a circular shape, and an oval shape. For example, size of the chip 100 is can be 10 square millimeters, 100 square millimeters or the like.

Figure 4:
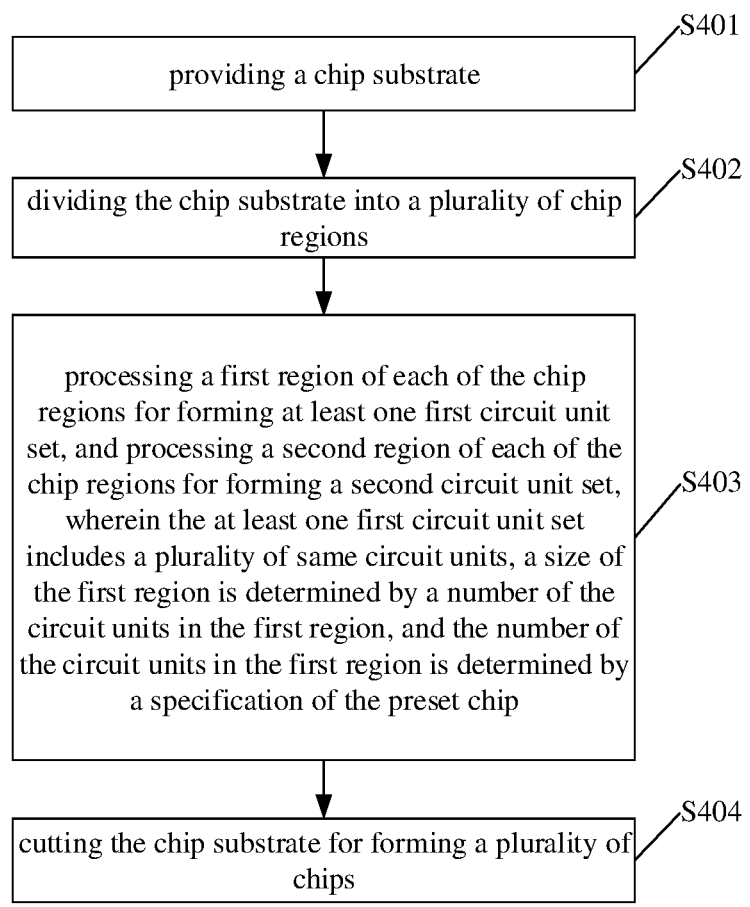
FIG. 4 is an illustrative flowchart of a method of manufacturing the chip according to one embodiment of the present disclosure.

FIG. 4 is an illustrative flowchart of a method of manufacturing the chip 100 according to one embodiment of the present disclosure. The method of manufacturing the chip 100 includes following action blocks.

At block S401, a chip substrate is provided.

At block S402, the chip substrate is divided into a plurality of chip regions.

At block S403, a first region of each of the chip regions is processed for forming at least one first circuit unit set. A second region of each of the chip regions is processed for forming a second circuit unit set. The at least one first circuit unit set includes a plurality of same circuit units. A size of the first region is determined by a number of the circuit units in the first region. The number of the circuit units in the first region is determined by a specification of the chip.

At block S404, the chip substrate is cut to form a plurality of chips.

In the method of manufacturing the chip 100, a specification of the chip 100 and size of the first region 110 are determined by the number of the circuit units in the first region 110. The number of the circuit units in the first region 110 is determined by a specification of the chip 100. In other words, size of the lower specification chip is relatively less than size of the high-specification chip, so that the number of lower specification chips which is produced by a same chip substrate can be increased relatively, and the cost of single lower specification chip can be correspondingly reduced to decrease the chip cost. Additionally, since the lower specification chip is formed by physically adjusting the number of the circuit units in the first region 110 for reducing specification level of chips, there is no need to form the lower specification chip by reducing performance of the high-specification chip using a fuse-melted manner, so that configuration efficiency of the chips having different specifications can be improved.

For example, a 12-inch chip substrate is fixed at the total price. When yield rate of products is predetermined, larger number of chips produced by the chip substrate means that the cost of single chip is reduced. The number of chips which can be produced by the chip substrate is determined by the chip size (e.g., a core size or a die size). For example, the die size of the chip A is 100 square millimeters, so that 660 chips A can be produced by the 12-inch chip substrate. The die size of the chip B is 10 square millimeters, so that number of 6600 chips B can be produced by the 12-inch chip substrate. Thus, the production cost difference between the chip A and the chip B is 10 multiples.

In embodiments of FIG. 2 and FIG. 3 in the present disclosure, the chip is a first chip 200 or a second chip 300. The specification of the first chip 200 is better than the specification of the second chip 300. The size of the first region 210 of the first chip 200 is greater than the size of the first region 310 of the second chip 300. The first chip 200 has at least one more circuit unit 20 (e.g., three circuit units in FIG. 2) than the second chip 300. The at least one circuit unit 20 is arranged in a side region 211 of the first region 210, and except the side region 211, an area of an region of the first chip 200 is the same as an area of an region of the second chip 300. In other words, the first chip 200 is the same as the second chip 300 except the side region 211. As shown in FIG. 2, in the first chip 200, the first region 210 is formed by at least one first circuit unit set 210*a*. The second region 220 is formed by a second circuit unit set 220*a*. As shown in FIG. 3, in the second chip 300, the first region 310 is formed by at least one first circuit unit set 310*a*. The second region 320 is formed by a second circuit unit set 320*a*.

The difference between the first chip 200 and the second chip 300 is the at least one circuit unit 20 in the side region 211. In other words, the second chip 300 can be regarded as part of the first chip 200. The side region 211 is easily distinguished from the first chip 200. In view of chip design and manufacturing stages, as long as the first chip 200 is stably formed, the second chip 300 can be formed by only directly cutting the side region 211 of the first chip 200, so that the cost expenditure of the second chip 300 in the development and manufacturing stages is greatly reduced. The manufacturing methods of the first chip 200 and the second chip 300 can reduce the cost and improve the competitiveness of products.

In one embodiment, the circuit units 20 include a plurality of analog circuits or digital circuits.

In one embodiment, each of the circuit units is selected from the group consisting of transistors, resistors, capacitors, inductors, and metal wirings. The transistors can be, for example, a diode, a triode, a field-effect transistor and the like. The number of components, such as transistors, resistors, capacitors, inductors, and metal wirings, in the circuit units of the present disclosure is not limited.

In one embodiment, a shape of the chip 100 is selected from the group consisting of a square shape, a rectangular shape, a circular shape, and an oval shape. For example, size of the chip 100 is can be 10 square millimeters, 100 square millimeters or the like.

In one embodiment, the chip substrate is a wafer.

In one embodiment, providing the chip substrate further includes following actions. The silicon material is melted for forming liquid silicon. The liquid silicon is injected into a quartz container. The liquid silicon is rotated and stretched for forming a cylindrical silicon ingot.

The cylindrical silicon ingot is sliced, to obtain a silicon ingot slice. The substance atoms are added into the silicon ingot slice for forming the chip substrate.

In one embodiment, when processing the first region of each of the chip regions for forming the at least one first circuit unit set, a coating operation, an exposure operation, a developing operation, an etching operation, a particle implantation operation, and a metal sputtering operation are performed, for forming the at least one first circuit unit set.

Figure 5:
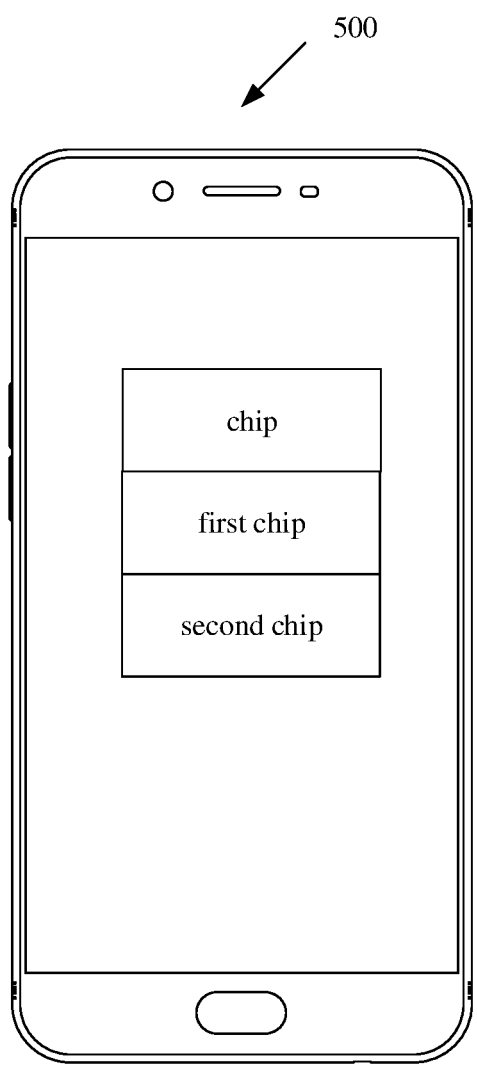
FIG. 5 is an illustrative structural diagram of a mobile terminal according to one embodiment of the present disclosure.

FIG. 5 is an illustrative structural diagram of a mobile terminal 500 according to one embodiment of the present disclosure. The mobile terminal 500 includes at least one chip, as shown illustrated in FIG. 1 to FIG. 3.

The at least one chip includes different components, such as at least one processor and memory, that are arranged in the mobile terminal 500. A smart phone having multiple cores are installed with the at least one processor, so that different configuration specifications of chips are achieved. For example, the mobile terminal 500 can be a mobile phone, a tablet computer, a notebook computer and the like.

The actions of the method disclosed by the embodiments of present disclosure can be embodied directly as a hardware decoding processor can be directly executed by a hardware decoding processor, or by combinations of hardware and software codes in a decoding processor. The software codes can be stored in a storage medium selected from one group consisting of random access memory, a flash memory, a read-only memory, a programmable read-only memory, an electrically erasable programmable memory, and registers. The processor read information (e.g., instructions) in the memory and completes the above-mentioned actions of the method in combination with hardware.

As is understood by a person skilled in the art, the foregoing preferred embodiments of the present disclosure are illustrative rather than limiting of the present disclosure. It is intended that they cover various modifications and similar arrangements be included within the spirit and scope of the present disclosure, the scope of which should be accorded the broadest interpretation so as to encompass all such modifications and similar structures.

What is claimed is:

1. A method for manufacturing a plurality of chips, comprising:
    dividing a chip substrate into a plurality of chip regions;
    processing a first region of each of the chip regions for forming at least one first circuit unit set;
    processing a second region of each of the chip regions for forming a second circuit unit set, and cutting the chip substrate into the plurality of chip regions for forming the plurality of chips, wherein the at least one first circuit unit set in the first region of each chip comprises a plurality of same circuit units, a size of the first region of each chip is determined by a number of the same circuit units in the first region of the corresponding chip, and the number of the same circuit units in the first region of each chip determines a specification of the chip, wherein the specification of the chip comprises an operational frequency of the corresponding chip, the plurality of chips comprise a first chip and a second chip, and the operational frequency of the specification of the first chip is higher than the operational frequency of the specification of the second chip.

2. The method according to claim 1, wherein a size of the first region of the first chip is greater than a size of the first region of the second chip; and
    wherein the first chip has at least one more circuit unit than the second chip, the at least one more circuit unit is arranged in a side region of the first region of the first chip, and the first chip is the same as the second chip except the side region.

3. The method according to claim 1, wherein the same circuit units in the first region comprise a plurality of analog circuits or a plurality of digital circuits.

4. The method according to claim 1, wherein each of the same circuit units in the first region is selected from the group consisting of transistors, resistors, capacitors, inductors, and metal wirings.

5. The method according to claim 1, wherein a shape of each chip is selected from the group consisting of a square shape, a rectangular shape, a circular shape, and an oval shape.

6. The method according to claim 1, wherein the chip substrate is a wafer.

7. The method according to claim 1, further comprising providing the chip substrate, wherein providing the chip substrate comprises:
    melting a silicon material for forming liquid silicon;
    injecting the liquid silicon into a quartz container;
    rotating the liquid silicon for stretching the liquid silicon so that a cylindrical silicon ingot is formed;
    slicing the cylindrical silicon ingot to obtain a silicon ingot slice; and
    adding atoms of material into the silicon ingot slice for forming the chip substrate.

8. The method according to claim 1, wherein processing the first region of each of the chip regions for forming the at least one first circuit unit set, comprises:
    performing a coating operation, an exposure operation, a developing operation, an etching operation, a particle implantation operation, and a metal sputtering operation, for forming the at least one first circuit unit set.

* * * * *